(12) United States Patent
Kim

(10) Patent No.: US 9,660,001 B2
(45) Date of Patent: May 23, 2017

(54) ORGANIC LIGHT EMITTING DIODE DISPLAY

(71) Applicant: SAMSUNG DISPLAY CO., LTD., Yongin-si, Gyeonggi-do (KR)

(72) Inventor: Dong Gyu Kim, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/969,221

(22) Filed: Dec. 15, 2015

(65) Prior Publication Data

US 2016/0197124 A1 Jul. 7, 2016

(30) Foreign Application Priority Data

Jan. 6, 2015 (KR) .................. 10-2015-0001317

(51) Int. Cl.
*H01L 29/08* (2006.01)
*H01L 27/32* (2006.01)

(52) U.S. Cl.
CPC ........ *H01L 27/3218* (2013.01); *H01L 27/326* (2013.01); *H01L 27/3216* (2013.01)

(58) Field of Classification Search
CPC ............. H01L 27/3216; H01L 27/3218; H01L 27/3276; H01L 51/524

USPC .................. 257/40, 88, 89; 345/690
See application file for complete search history.

(56) References Cited

U.S. PATENT DOCUMENTS

| | | | |
|---|---|---|---|
| 9,219,251 B2* | 12/2015 | Kang ................... | H01L 51/5268 |
| 9,245,931 B2* | 1/2016 | Cho ..................... | H01L 27/3244 |
| 2011/0147770 A1* | 6/2011 | Hwang ................. | H01L 27/326 257/89 |
| 2012/0074435 A1* | 3/2012 | Ha ....................... | H01L 51/5203 257/88 |
| 2013/0113843 A1* | 5/2013 | Yamazaki ............. | H01L 27/326 345/690 |

FOREIGN PATENT DOCUMENTS

| | | |
|---|---|---|
| KR | 10-2011-0071446 A | 6/2011 |
| KR | 10-2012-0019016 A | 3/2012 |
| KR | 10-2012-0039453 A | 4/2012 |
| KR | 10-2013-0071543 A | 7/2013 |

* cited by examiner

*Primary Examiner* — Mohammed Shamsuzzaman
(74) *Attorney, Agent, or Firm* — Lee & Morse P.C.

(57) ABSTRACT

An organic light emitting diode display includes a plurality of transmission window areas arranged in a matrix form, a plurality of green pixels arranged in a plurality of horizontal line areas among the plurality of transmission window areas, and a plurality of red pixels and a plurality of blue pixels arranged in a plurality of vertical line areas among the plurality of transmission window areas.

15 Claims, 4 Drawing Sheets

ORGANIC LIGHT EMITTING DIODE DISPLAY

CROSS-REFERENCE TO RELATED APPLICATION

Korean Patent Application No. 10-2015-0001317, filed on Jan. 6, 2015, in the Korean Intellectual Property Office, and entitled: "Organic Light Emitting Diode Display," is incorporated by reference herein in its entirety.

BACKGROUND

1. Field

Embodiments relate to an organic light emitting diode display, and more particularly, to a transparent organic light emitting diode display.

2. Description of the Related Art

An organic light emitting diode display is a display device that displays an image by using an organic light emitting diode emitting light. The light is emitted by energy generated when an exciton, generated when an electron and a hole are coupled with each other in an organic emission layer of the organic light emitting diode, falls down from an excited state to a ground state.

The organic light emitting diode display may be manufactured as a transparent organic light emitting diode display in which an object, an image, or the like, which is positioned at an opposite side of the display device, is viewed through the display device. For example, the transparent organic light emitting diode display may transmit the object or the image which is positioned at an opposite side thereof during a switch-off state, while displaying an image by the light emitted from the organic light emitting diode during a switch-on state.

SUMMARY

Embodiments provide a transparent organic light emitting diode display exhibiting good transmittance and light emission aperture ratio.

An exemplary embodiment provides an organic light emitting diode display including a plurality of transmission window areas arranged in a matrix form, a plurality of green pixels arranged in a plurality of horizontal line areas among the plurality of transmission window areas, and a plurality of red pixels and a plurality of blue pixels arranged in a plurality of vertical line areas among the plurality of transmission window areas.

The plurality of transmission window areas may be formed in a quadrangular shape and has an area ratio of 45% or more on a screen.

The plurality of green pixels may be arranged according to a column of the plurality of transmission window areas.

The plurality of red pixels and the plurality of blue pixels may be alternately arranged according to a row of the plurality of transmission window areas.

The red pixels and the blue pixels may be alternately arranged in the row of the plurality of transmission window areas.

Sizes of areas of one green pixel, one red pixel, and one blue pixel may be different from each other.

Sizes of areas of one red pixel and one blue pixel may be the same as each other.

A size of the area of one green pixel may be ½ of the area of one red pixel or one blue pixel.

The plurality of green pixels may have a rectangular shape having a long side in the horizontal direction and a short side in the vertical direction.

The plurality of red pixels and the plurality of blue pixels may have a rectangular shape having a short side in the horizontal direction and a long side in the vertical direction.

The organic light emitting diode display may further include a plurality of gate lines disposed in the plurality of horizontal line areas.

The organic light emitting diode display may further include a plurality of data lines disposed in the plurality of vertical line areas.

The organic light emitting diode display may further include a plurality of power lines disposed in the plurality of vertical line areas.

The plurality of red pixels and the plurality of blue pixels may include light emitting elements, respectively, and the plurality of data lines and the plurality of power lines may be disposed below the light emitting element of each of the plurality of red pixels and the plurality of blue pixels.

Each of the plurality of green pixels may include a light emitting element, and the plurality of gate lines is disposed below the light emitting element of each of the plurality of green pixels.

The plurality of green pixels, the plurality of red pixels, and the plurality of blue pixels may have an area ratio of approximately 25%.

Transmittance of the plurality of transmission window areas may be 30% or more.

The plurality of transmission window areas may include an empty space configured by a first substrate and an encapsulation member facing each other.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
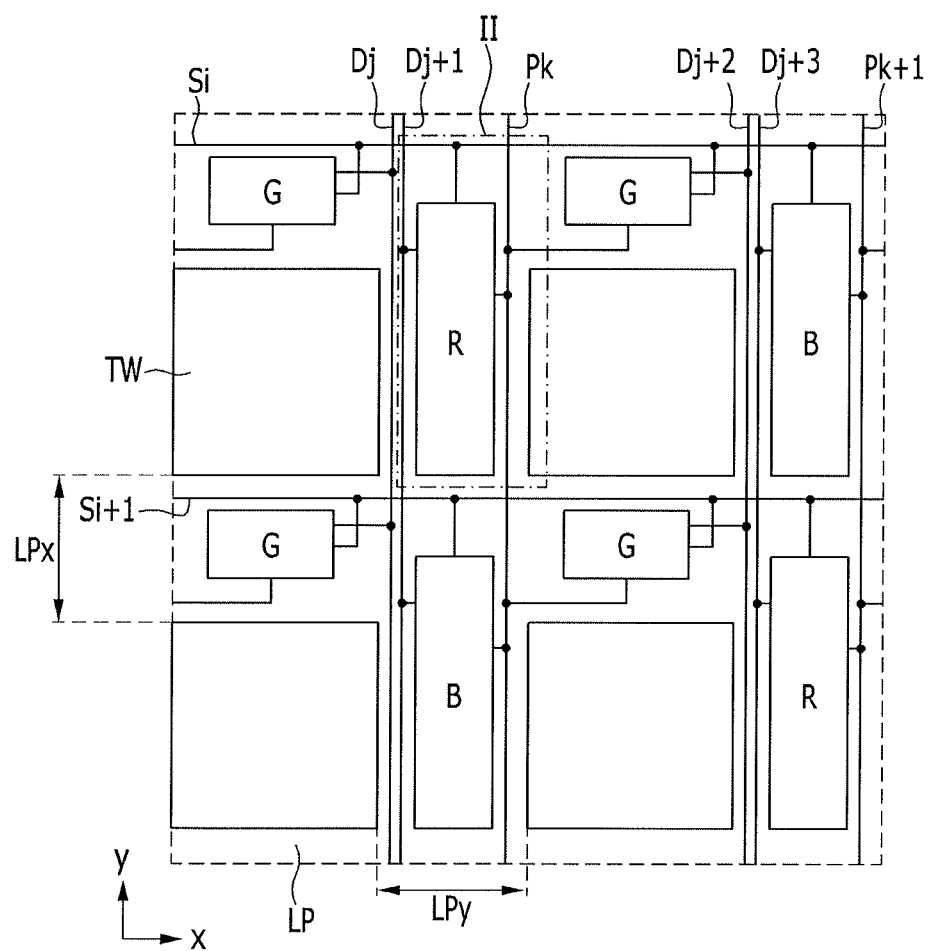
FIG. 1 illustrates a layout view of an organic light emitting diode display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout. Further, since like reference numerals designate like elements having the same configuration, a first exemplary embodiment is representatively described, and in other exemplary embodiments, only a configuration different from the first exemplary embodiment will be described. Accordingly, the drawings and description are to be regarded as illustrative in nature and not restrictive.

It will also be understood that when an element is referred to as being "on" another element or substrate, it can be directly on the other element or substrate, or intervening elements may also be present. In addition, it will also be understood that when an element is referred to as being "between" two elements, it can be the only element between the two elements, or one or more intervening elements may also be present. Further, throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising," will be understood to imply the inclusion of stated elements but not the exclusion of any other elements.

Hereinafter, an organic light emitting diode display according to an exemplary embodiment will be described with reference to FIGS. 1 to 3.

FIG. 1 is a layout view illustrating an organic light emitting diode display device according to an exemplary embodiment. FIG. 2 is an enlarged layout view illustrating region II of FIG. 1, and FIG. 3 is a cross-sectional view of FIG. 2 along line III-III.

Figure 2:
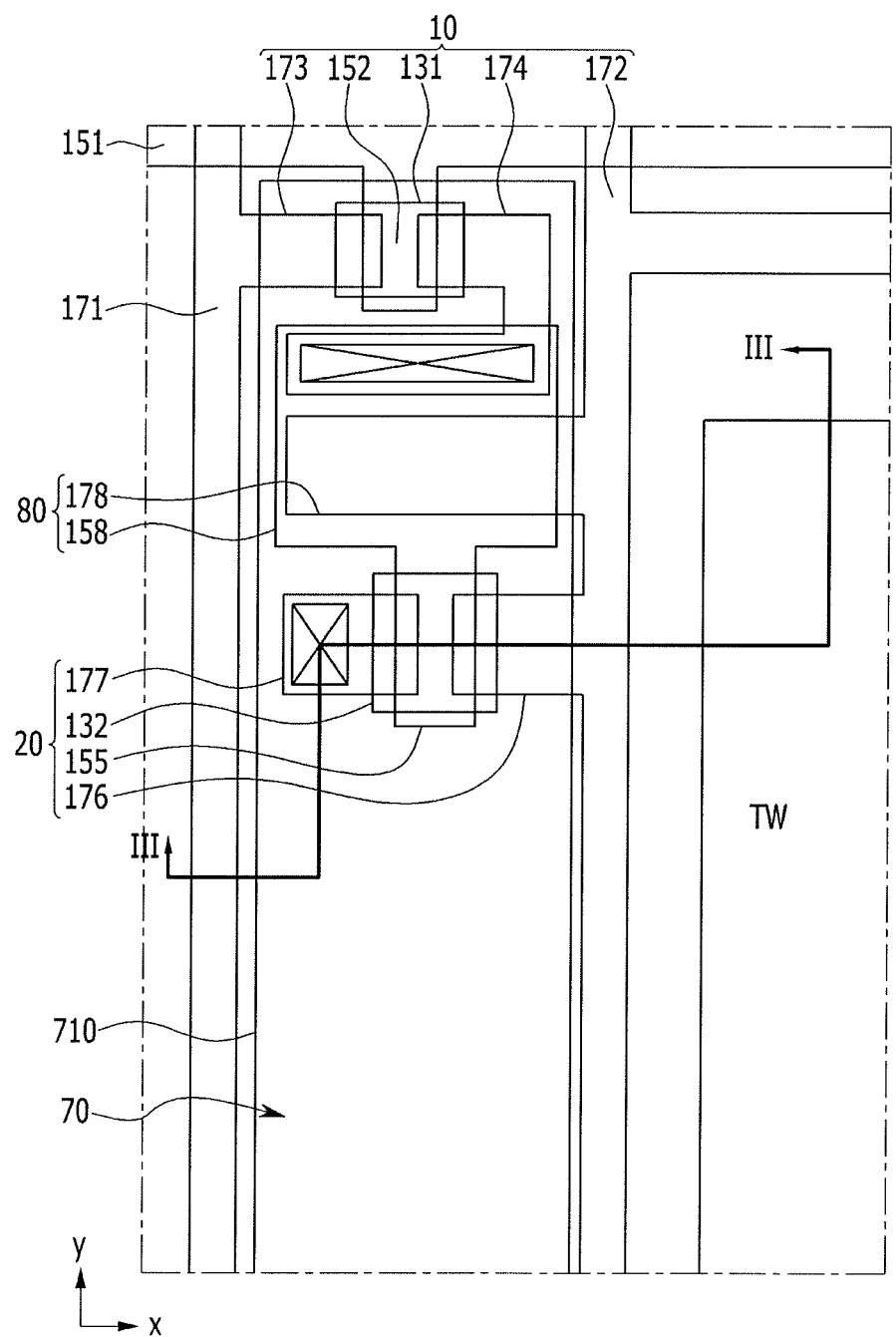
FIG. 2 illustrates an enlarged layout view of region II of FIG. 1.
Figure 3:
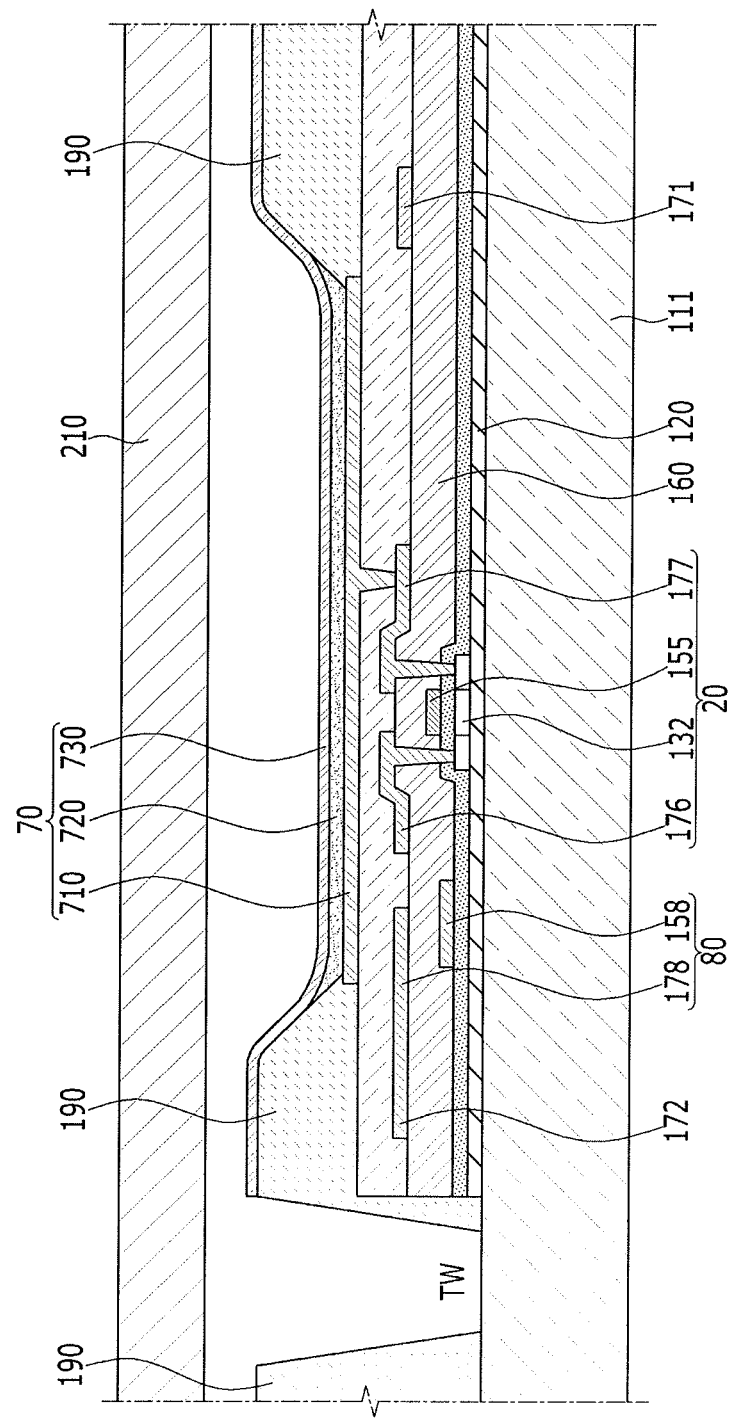
FIG. 3 illustrates a cross-sectional view of FIG. 2 taken along line III-III.

Referring to FIGS. 1 to 3, an organic light emitting diode display 100 may include a plurality of transmission window areas TW, and a line area LP in which a plurality of pixels is disposed.

Each of the plurality of transmission window areas TW may have a quadrangular shape. Here, the quadrangular shape does not necessarily mean an exact quadrangular shape of which edges are perpendicular to each other, but means that the overall shape is a square or a rectangle. The plurality of transmission window areas TW may be arranged at regular intervals in a first direction, e.g., a horizontal direction along the x-axis, and a second direction, e.g., a vertical direction along a y-axis. That is, the plurality of transmission window areas TW may be arranged in a matrix form.

The transmission window area TW has an area ratio of about 45% or more with respect to its corresponding pixel unit. For example, in a pixel unit including one transmission window area TW and two pixels, e.g., a green pixel G and a red pixel R, an area of the transmission window area TW is about 45% or more of an area of the entire pixel unit. When transmittance of the transmission window area TW is about 70%, the transmittance of the organic light emitting diode display 100 is about 30% or more.

A plurality of pixels is arranged in the line area LP among the plurality of transmission window areas TW. The plurality of pixels includes a green pixel G, a red pixel R, and a blue pixel B. The green pixel G emits green-based light, the red pixel R emits red-based light, and the blue pixel B emits blue-based light. The line area LP is divided into a plurality of horizontal line areas LPx and a plurality of vertical line areas LPy among the plurality of transmission window areas TW which is arranged in a matrix form. For example, one vertical line area LPy may be positioned between two transmission window areas TW adjacent to each other along the first direction. e.g., along the x-axis.

In the horizontal line area LPx, a plurality of green pixels G is arranged according to a column of the transmission window area TW. Accordingly, a repeating, sequential arrangement order of a transmission window area TW, a green pixel G, a transmission window area TW, and a green pixel G is repeated in the vertical direction. The green pixel G may be formed in a rectangular shape having a long side in the horizontal direction and a short side in the vertical direction.

In the vertical line area LPy, the plurality of red pixels R and the plurality of blue pixels B are alternately arranged according to a row of the transmission window area TW. In this case, in the row of the transmission window area TW, the red pixels R and the blue pixels B are alternately arranged. Accordingly, a repeating, sequential arrangement order of a transmission window area TW, a red pixel R, a transmission window area TW, and a blue pixel B is repeated in the horizontal direction. The red pixel R and the blue pixel B may be formed in a rectangular shape having a short side in the horizontal direction and a long side in the vertical direction.

Sizes of areas of the green pixel G, the red pixel R, and blue pixel B may be different from each other. The sizes of the areas of the red pixel R and the blue pixel B may be the same as each other, and the size of the area of the green pixel G may be about ½ of the area of the red pixel R or the blue pixel B. The green pixel G, the red pixel R, and the blue pixel B may have an area ratio of approximately 25%. That is, the light emission aperture ratio of the organic light emitting diode display 100 is approximately 25%.

In each horizontal line area LPx, one of the gate lines Si and Si+1 is disposed. The adjacent green pixel G, red pixel R, and blue pixel B are connected to each other in, e.g., through, the gate lines Si and Si+1. In each vertical line area LPy, data lines Dj to Dj+3 and power lines Pk and Pk+1 are arranged. In one vertical line area LPy, the data lines Dj and Dj+2 connected to the green pixel G, and the data lines Dj+1 and Dj+3 connected to the red pixel R and the blue pixel B may be arranged. The adjacent green pixel G, red pixel R, and blue pixel B are connected to each other in, e.g., through, the power lines Pk and Pk+1.

Here, in order to clearly describe a connection relationship among the gate lines Si and Si+1, the data lines Dj to Dj+3, the power lines Pk and Pk+1, and the plurality of pixels, the areas of the green pixel G, the red pixel R, and the blue pixel B and the lines do not overlap with each other. However, as described below in FIGS. 2 and 3, the data line and the power line may be disposed below organic light emitting diodes 70 of the red pixel R and the blue pixel B. Further, the gate line may be disposed below the organic light emitting diode 70 of the green pixel G.

Hereinafter, a pixel structure of the organic light emitting diode display 100 will be described in detail with reference to FIGS. 2 and 3.

In FIGS. 2 and 3, a structure in which two thin film transistors 10 and 20 and one capacitor 80 are included in one pixel is exemplified, but the organic light emitting diode display 100 according to embodiments is not limited thereto. For example, the pixel of the organic light emitting diode display 100 according to embodiments may include three or more thin film transistors and two or more capacitors, and as a result, may have various structures in which a separate wiring is further formed.

Referring to FIGS. 2-3, on a first substrate 111, a switching transistor 10, a driving transistor 20, a capacitor 80, and an organic light emitting diode 70 are disposed. The first substrate 111 may be made of a transparent insulating material, e.g., glass, quartz, ceramic, transparent plastic, or the like. The first substrate 111 may be formed as a transparent flexible substrate.

A buffer layer 120 may be positioned on the first substrate 111. The buffer layer 120 serves to planarize a surface while preventing an unnecessary component, e.g., impurities or moisture, from permeating. The buffer layer 120 may be formed in a single layer of silicon nitride ($SiN_x$) or a double-layer structure in which silicon nitride ($SiN_x$) and silicon oxide ($SiO_2$) are laminated. The buffer layer 120 is not a necessarily required configuration and may be omitted according to a kind of first substrate 111 and a process condition.

On the first substrate 111, a gate line 151 disposed in a first direction, and a data line 171 and a power line 172 which are insulated from the gate line 151 to cross each other are disposed. The data line 171 and the power line 172 are disposed below the organic light emitting diode 70, as illustrated in FIG. 3. The gate line 151 may be disposed on the same layer, i.e., at a same height level with respect to the first substrate 111, as a driving gate electrode 155 of the driving transistor 20. In the case of the green pixel G, the gate line 151 may be disposed below the organic light emitting diode 70.

The organic light emitting diode 70 includes a first electrode 710, an organic emission layer 720 formed on the first electrode 710, and a second electrode 730 formed on the organic emission layer 720. The first electrode 710 is formed in a rectangular shape corresponding to a light emission area of the pixel. An upper insulating layer 190 exposing the first electrode 710 is disposed around the first electrode 710. The organic emission layer 720 is formed on a portion of the first electrode 710 exposed by the upper insulating layer 190. The second electrode 730 is formed on the upper insulating layer 190 and the organic emission layer 720. Holes and electrons are injected into the organic emission layer 720 from the first electrode 710 and the second electrode 730, respectively. When an exciton formed by coupling the injected holes and electrons with each other falls down from an excited state to a ground state, light is emitted.

The capacitor 80 includes a pair of capacitor plates 158 and 178 disposed with an interlayer insulating layer 160 therebetween. The interlayer insulating layer 160 becomes a dielectric material of the capacitor 80.

The switching transistor 10 includes a switching semiconductor layer 131, a switching gate electrode 152, a switching source electrode 173, and a switching drain electrode 174. The switching transistor 10 is used as a switching element selecting a pixel to emit light. The switching gate electrode 152 is connected to the gate line 151. The switching source electrode 173 is connected to the data line 171. The switching drain electrode 174 is spaced apart from the switching source electrode 173 and connected to the capacitor plate 158.

The driving transistor 20 includes a driving semiconductor layer 132, the driving gate electrode 155, a driving source electrode 176, and a driving drain electrode 177. The driving transistor 20 applies driving power for emitting light of the organic emission layer 720 of the organic light emitting diode 70 in the selected pixel, to the first electrode 710. The driving gate electrode 155 is connected with the capacitor plate 158 which is connected with the switching drain electrode 174. The driving source electrode 176 and the other capacitor plate 178 are connected with the power line 172, respectively. The driving drain electrode 177 is connected with the first electrode 710 of the organic light emitting diode 70 through a contact hole.

The switching transistor 10 serves to operate by the gate voltage applied to the gate line 151 to transfer a data voltage applied to the data line 171 to the driving transistor 20. A voltage which corresponds to a difference between the power voltage applied to the driving transistor 20 from the power line 172 and the data voltage transferred from the switching transistor 10 is stored in the capacitor 80, and a current corresponding to the voltage stored in the capacitor 80 flows to the organic light emitting diode 70 through the driving transistor 20 and the organic light emitting diode 70 emits the light. The organic light emitting diode 70 may be a top emission structure in which light is emitted in an upper direction.

A transparent encapsulation member 210 is disposed on the organic light emitting diode 70. The encapsulation member 210 is assembled with the first substrate 111 by a sealant (not illustrated) to seal an internal space, and protects the organic light emitting diode 70 and the thin film transistors 10 and 20. The encapsulation member 210 may be a transparent insulating substrate, e.g., a glass substrate or a plastic substrate. Alternatively, the encapsulation member 210 may be a transparent encapsulation thin film including a plurality of passivation layers which is sequentially laminated.

As further illustrated in FIG. 3, the transmission window area TW is formed through the upper insulating layer 190 between the first substrate 111 and the transparent encapsulation member 210, e.g., the transmission window area TW may extend through an entire thickness between the first substrate 111 and the transparent encapsulation member 210. The transmission window area TW may include an empty space configured by the first substrate 111 and the encapsulation member 210 facing the first substrate 111. The transmission window area TW may be defined by the upper insulating layer 190. That is, the plurality of transmission window areas TW having a quadrangular shape which is arranged in a matrix form may be formed by, e.g., through, the upper insulating layer 190.

Figure 4:
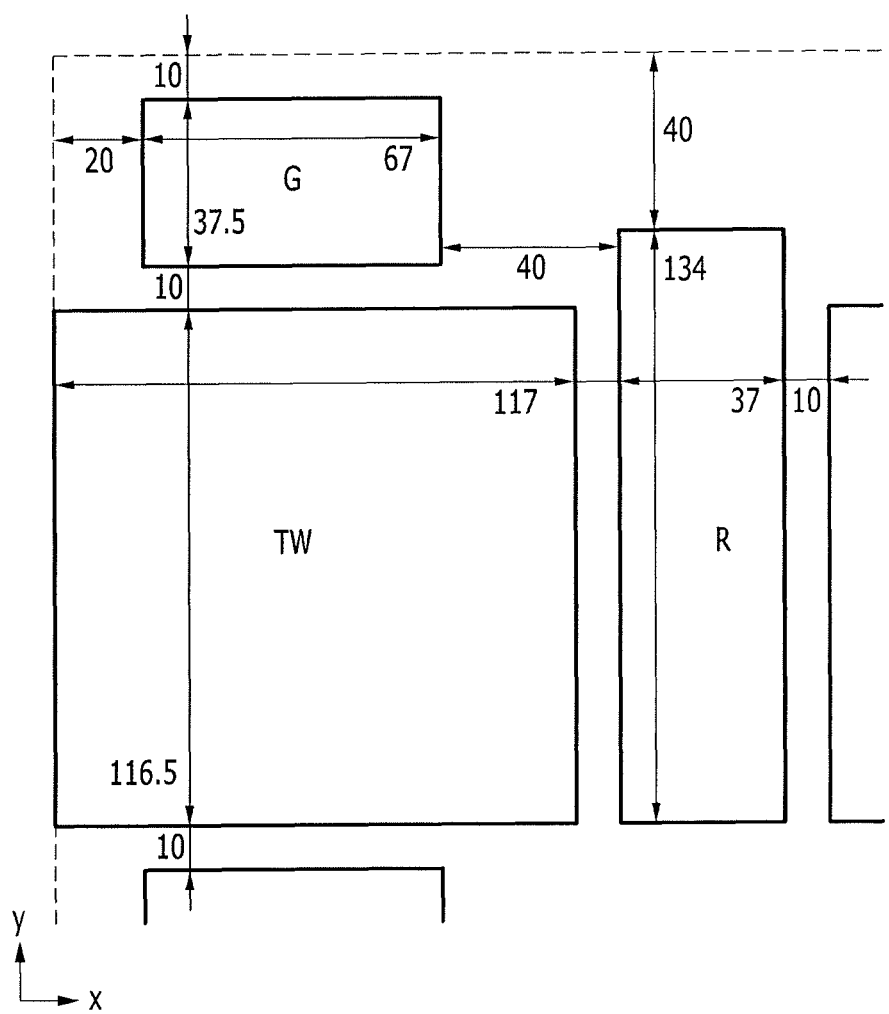
FIG. 4 illustrates a plan view exemplifying sizes of a transmission window area and a pixel area in an actual 30-inch UHD monitor.

FIG. 4 is a plan view exemplifying sizes of the transmission window area TW and a pixel area in an actual 30-inch UHD monitor.

Referring to FIG. 4, the transmission window area TW has a size of a width of 117 μm and a length of 116.5 μm, the green pixel G has a size of a width of 67 μm and a length of 37.5 μm, and the red pixel R or the blue pixel B has a size of a width of 37 μm and a length of 134 μm. A distance between the transmission window area TW and each of the green pixel G or the red pixel R is 10 μm.

A unit area of a quadrangle configured by one transmission window area TW, one green pixel G, and one red pixel R (or one blue pixel B) has a size of a width of 174 μm and a length of 174 μm. In the unit area, an area occupied by the transmission window area TW is approximately 45%. In the unit area, a combined area occupied by the green pixel G and the red pixel R is approximately 25%.

By way of summation and review, a unit pixel of a transparent organic light emitting diode display is divided into a transmission area and a light emission area. In this case, for a good transmission characteristic, transmittance needs to be 30% or more in the unit pixel. However, a conventional transparent organic light emitting diode display may include a low-reflective film, a multi-layered transparent layer, or the like, thereby reducing the transmittance of the transmission area to 70% or less. Accordingly, in a unit pixel, an area of the transmission area needs to be at least 45%. In addition, the remaining area needs to include the organic light emitting diode, in which case, the light emission aperture ratio is greatly reduced.

Accordingly, in the organic light emitting diode display 100 according to example embodiments, the plurality of transmission window areas TW occupies an area of approximately 45% of the screen, and the plurality of pixels may occupy an area of approximately 25% of the screen. When the transmittance of the transmission window area TW is approximately 70%, the organic light emitting diode display 100 may have transmittance of 30% or more. Further, the organic light emitting diode display 100 may have a light emission aperture ratio of approximately 25%. The organic light emitting diode display 100 may ensure good transmittance and light emission aperture ratio.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An organic light emitting diode display, comprising:
   a plurality of transmission window areas arranged in a matrix form;
   a plurality of green pixels arranged in a plurality of horizontal line areas among the plurality of transmission window areas;
   a plurality of red pixels and a plurality of blue pixels arranged in a plurality of vertical line areas among the plurality of transmission window areas;
   wherein the plurality of green pixels is alternately arranged with the plurality of transmission window areas in columns;
   wherein the plurality of red pixels and the plurality of blue pixels are alternately arranged with the plurality of transmission window areas in rows.

2. The organic light emitting diode display as claimed in claim 1, wherein each of the plurality of transmission window areas is quadrangular and has an area of about 45% or more of its corresponding unit pixel.

3. The organic light emitting diode display as claimed in claim 1, wherein sizes of areas of one green pixel, one red pixel, and one blue pixel are different from each other.

4. The organic light emitting diode display as claimed in claim 1, wherein sizes of areas of one red pixel and one blue pixel are the same.

5. The organic light emitting diode display as claimed in claim 4, wherein a size of the area of one green pixel is ½ of the area of one red pixel or one blue pixel.

6. The organic light emitting diode display as claimed in claim 1, wherein the plurality of green pixels has a rectangular shape having a long side in the horizontal direction and a short side in the vertical direction.

7. The organic light emitting diode display as claimed in claim 6, wherein the plurality of red pixels and the plurality of blue pixels have a rectangular shape having a short side in the horizontal direction and a long side in the vertical direction.

8. The organic light emitting diode display as claimed in claim 7, further comprising a plurality of gate lines disposed in the plurality of horizontal line areas.

9. The organic light emitting diode display as claimed in claim 8, further comprising a plurality of data lines disposed in the plurality of vertical line areas.

10. The organic light emitting diode display as claimed in claim 9, further comprising a plurality of power lines disposed in the plurality of vertical line areas.

11. The organic light emitting diode display as claimed in claim 10, wherein:
    the plurality of red pixels and the plurality of blue pixels include light emitting elements, respectively, and
    the plurality of data lines and the plurality of power lines are disposed below the light emitting element of each of the plurality of red pixels and the plurality of blue pixels.

12. The organic light emitting diode display as claimed in claim 8, wherein each of the plurality of green pixels includes a light emitting element, and the plurality of gate lines is disposed below the light emitting element of each of the plurality of green pixels.

13. The organic light emitting diode display as claimed in claim 1, wherein the plurality of green pixels, the plurality of red pixels, and the plurality of blue pixels have an area ratio of approximately 25%.

14. The organic light emitting diode display as claimed in claim 13, wherein transmittance of the plurality of transmission window areas is 30% or more.

15. The organic light emitting diode display as claimed in claim 14, wherein the plurality of transmission window areas includes an empty space configured by a first substrate and an encapsulation member facing each other.

* * * * *